(12) United States Patent
Wolaver

(10) Patent No.: US 7,680,220 B2
(45) Date of Patent: Mar. 16, 2010

(54) NUMERICAL PHASE DETECTOR WITH INTERPOLATED VALUES

(75) Inventor: Dan Holden Wolaver, 71 Dodge Rd., Greenfield, NH (US) 03047

(73) Assignee: Dan Holden Wolaver, Greenfield, NH (US)

( * ) Notice: Subject to any disclaimer, the term of this patent is extended or adjusted under 35 U.S.C. 154(b) by 921 days.

(21) Appl. No.: 11/397,215

(22) Filed: Apr. 4, 2006

(65) Prior Publication Data

US 2006/0227919 A1    Oct. 12, 2006

Related U.S. Application Data

(60) Provisional application No. 60/668,279, filed on Apr. 6, 2005.

(51) Int. Cl.
*H04L 27/06*    (2006.01)

(52) U.S. Cl. .............. 375/341; 375/371; 375/372; 375/373; 375/374; 375/375; 375/376

(58) Field of Classification Search ............ 375/341, 375/371–376

See application file for complete search history.

(56) References Cited

U.S. PATENT DOCUMENTS

| 5,126,737 A | * | 6/1992 | Torii ........................... 341/61 |
| 5,222,101 A | * | 6/1993 | Ariyavisitakul et al. ..... 375/231 |

* cited by examiner

*Primary Examiner*—Curtis B Odom

(57) ABSTRACT

A phase measurement circuit is described that receives a signal with irregularly spaced edges and assigns a numerical value to the phase of each edge. An interpolator provides linear interpolation between successive values to provide continuous phase values at smaller, regular intervals. The interpolated values are resampled at a lower, regular rate to simplify subsequent processing by filters or other data-reduction means. The interpolation is performed without dividers or two-variable multipliers.

5 Claims, 9 Drawing Sheets

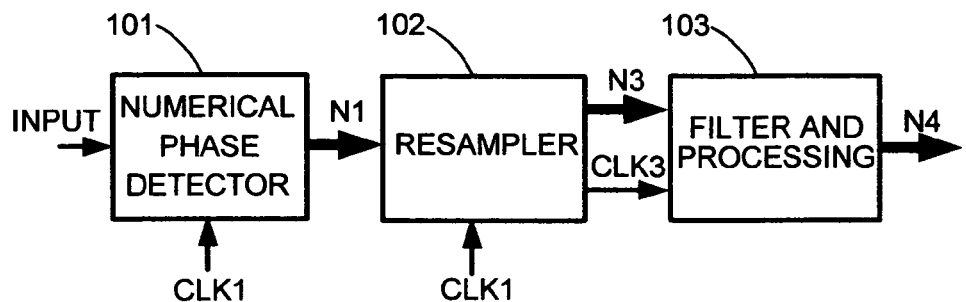
Fig. 1 *Prior Art*
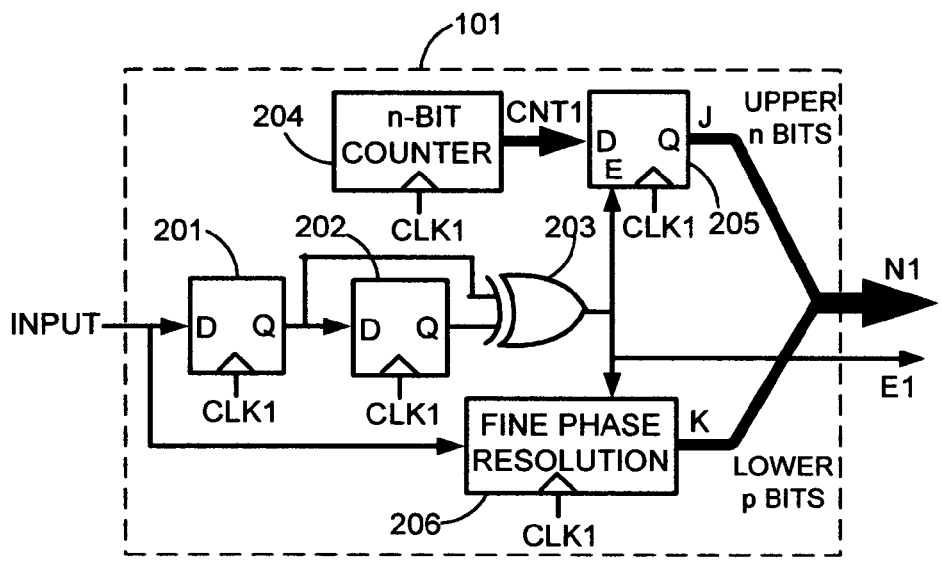
Fig. 2 *Prior Art*
```
        FOR m = 1, n = 4, and p = 3
CNT1  0 1 2 3 4 5 6 7 8 9 A B C D E F 0 1 2 3 4 5 6 7 8 9 A B C D E F 0 1 2 3 4 5 6 7 8 9 A B C D E F 0 1 2 3 4
CLK1 ⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍⎍
INPUT
E1
   J  E 0 0 0 0 4 4 6 6 8 8 A A C C E E E E E E 4 4 4 4 4 4 A A A A E E E E E E 4 4 4 4 4 4 4 4 4 4 4 4 0 0 2 2
   K  7 3 3 3 3 1 1 6 6 5 5 2 2 7 7 1 1 1 1 1 1 0 0 0 0 0 0 4 4 4 4 2 2 2 2 2 2 3 3 3 3 3 3 3 3 3 3 3 3 0 0 6 6
  N1  E 0 0 0 0 4 4 6 6 8 8 A A C C E E E E E E 4 4 4 4 4 4 A A A A E E E E E E 4 4 4 4 4 4 4 4 4 4 4 4 0 0 2 2
      7 3 3 3 3 1 1 6 6 5 5 2 2 7 7 1 1 1 1 1 1 0 0 0 0 0 0 4 4 4 4 2 2 2 2 2 2 3 3 3 3 3 3 3 3 3 3 3 3 0 0 6 6
```
Fig. 3 *Prior Art*

| FOR G = 8, n = 7, 2ⁿ = 128 | | | | | | | | | |
|---|---|---|---|---|---|---|---|---|---|
| CNT1 | E3 | G×DJ | A | DN1 | E | B | D | C | M2 |
| 4 | 1 | 16 | 112 | 12 | 1 | 13 | 124 | 0 | 13 |
| 5 | 0 | 32 | 96 | 21 | 0 | 21 | 117 | 0 | 21 |
| 6 | 0 | 32 | 96 | 21 | 21 | 42 | 10 | 1 | 10 |
| 7 | 0 | 32 | 96 | 21 | 10 | 31 | 127 | 0 | 31 |
| 8 | 1 | 32 | 96 | 21 | 31 | 52 | 20 | 1 | 20 |

Fig. 16

| FOR G = 8 | | | | | | | | | | | | | | | | | |
|---|---|---|---|---|---|---|---|---|---|---|---|---|---|---|---|---|---|
| CNT1 | J | DJ | N1 | DN1 | M1 | G×DJ | M2 | T1 | T2 | T3 | T4 | T5 | T6 | T7 | Y | DY | N2 |
| 4 | 4 | 2 | 63 | 12 | 1 | 16 | 13 | 1 | 1 | 1 | 1 | 1 | 1 | 0 | 6 | 6 | 63 |
| 5 | | 4 | | 21 | 4 | 32 | 21 | 1 | 1 | 1 | 1 | 1 | 0 | 0 | 5 | 5 | 68 |
| 6 | | 4 | | 21 | 3 | 32 | 10 | 1 | 1 | 0 | 0 | 0 | 0 | 0 | 2 | 5 | 73 |
| 7 | | 4 | | 21 | 2 | 32 | 31 | 1 | 1 | 1 | 1 | 1 | 1 | 1 | 7 | 5 | 78 |
| 8 | 8 | 4 | 84 | 21 | 1 | 32 | 20 | 1 | 1 | 1 | 1 | 1 | 0 | 0 | 5 | 6 | 84 |
| 9 | | 3 | | 21 | 3 | 24 | 21 | 1 | 1 | 1 | 1 | 1 | 1 | 1 | 7 | 7 | 91 |
| 10 | | 3 | | 21 | 2 | 24 | 18 | 1 | 1 | 1 | 1 | 1 | 1 | 0 | 6 | 7 | 98 |
| 11 | 11 | 3 | 105 | 21 | 1 | 24 | 15 | 1 | 1 | 1 | 1 | 1 | 0 | 0 | 5 | 7 | 105 |
| 12 | | 11 | | 64 | 11 | 88 | 64 | 1 | 1 | 1 | 1 | 1 | 0 | 0 | 5 | 5 | 110 |
| 13 | | 11 | | 64 | 10 | 88 | 40 | 1 | 1 | 1 | 0 | 0 | 0 | 0 | 3 | 6 | 116 |
| 14 | | 11 | | 64 | 9 | 88 | 16 | 1 | 0 | 0 | 0 | 0 | 0 | 0 | 1 | 6 | 122 |
| 15 | | 11 | | 64 | 8 | 88 | 80 | 1 | 1 | 1 | 1 | 1 | 1 | 1 | 7 | 6 | 128 |
| 16 | | 11 | | 64 | 7 | 88 | 56 | 1 | 1 | 1 | 1 | 1 | 0 | 0 | 5 | 6 | 134 |
| 17 | | 11 | | 64 | 6 | 88 | 32 | 1 | 1 | 0 | 0 | 0 | 0 | 0 | 2 | 5 | 139 |
| 18 | | 11 | | 64 | 5 | 88 | 8 | 0 | 0 | 0 | 0 | 0 | 0 | 0 | 0 | 6 | 145 |
| 19 | | 11 | | 64 | 4 | 88 | 72 | 1 | 1 | 1 | 1 | 1 | 1 | 0 | 6 | 6 | 151 |
| 20 | | 11 | | 64 | 3 | 88 | 48 | 1 | 1 | 1 | 1 | 0 | 0 | 0 | 4 | 6 | 157 |
| 21 | | 11 | | 64 | 2 | 88 | 24 | 1 | 1 | 0 | 0 | 0 | 0 | 0 | 2 | 6 | 163 |
| 22 | 22 | 11 | 169 | 64 | 1 | 88 | 0 | 0 | 0 | 0 | 0 | 0 | 0 | 0 | 0 | 6 | 169 |

NUMERICAL PHASE DETECTOR WITH INTERPOLATED VALUES

CROSS-REFERENCES TO RELATED APPLICATIONS

This application is a non-provisional application based on Provisional Application Ser. No. 60/668,279 filed Apr. 6, 2005.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF MATERIAL SUBMITTED ON A COMPACT DISC

Not Applicable.

BACKGROUND OF THE INVENTION (1) Field of Invention

The present invention relates to phase comparison between a signal and a reference with irregular sampling of the phase and interpolation before regular resampling.

(2) Description of the Related Art

Numerical phase detectors assign numerical values to the time of occurrence (phase) of significant instants (zero crossings, edges, or arrival times) of an input signal compared to a reference signal. These phase detectors are used in phase-measurement instruments when high-frequency jitter is to be measured. In particular, time-interval analyzers apply a numerical time-stamp to signal edges, and some jitter measurement instruments measure the position of each zero crossing (see U.S. Pat. Nos. 6,255,866 and 6,529,842). Numerical phase detectors are also used in phase-locked loops for the purpose of synchronizing the frequency and phase of two signals. In particular, phase-locked loops that include a FIFO for data and phase-locked loops that have a very low bandwidth (milliHertz) use a numerical phase detector.

Numerical phase detectors can provide phase information only at the time of the event or edge. Therefore the timing of the phase information is irregular if the edges are irregularly spaced. In fact, any phase modulation on the input signal assures the intervals will be irregular, with the irregularity increasing for strong modulation. When the input signal is a Non-Return-to-Zero (NRZ) data signal, the edge spacing (and, consequently, the phase sample spacing) is very irregular—often varying over a range of ten to one. If the phase information is to be processed by filtering or rms calculations, the irregular timing introduces an error or makes the processing difficult.

In prior art, the problem of irregular phase-sample spacing is dealt with by simply resampling at regular intervals (see FIG. 1). But some phase values are missed when their spacing is shorter than the resampling interval, and other values are repeated when their spacing is longer than the resampling interval. This distorts the original waveform of the phase and leads to inaccurate results when the phase is filtered. An example of this waveform distortion is shown in FIG. 6. Here the INPUT signal is NRZ data, and the phase is ramping smoothly upward. It can be seen that the longer intervals between input edges cause repeated values in the resampled phase N3.

The problem of waveform distortion could be solved by performing interpolation before the resampling (see FIG. 7). The resampled phase would then be smooth, as shown in FIG. 8. Some simple interpolation schemes are know that apply to interpolation over regularly spaced intervals; U.S. Pat. No. 6,255,866 uses such a scheme in preparing phase information for jitter generation. The need here is to realize an interpolator that deal with changing interpolation intervals at the same time as changing phase increments. This can be done with software, but the algorithm is slow and usually can't be used with real-time applications. The interpolation can be done at high-speed with large custom circuits, but the realization is expensive; a typical high-speed interpolator is described in U.S. Pat. No. 5,020,014.

Because of the size and the expense, interpolation has not been used in real-time phase measurement with variable interpolation intervals.

BRIEF SUMMARY OF THE INVENTION

It is therefore an objective of the present invention to realize a high-speed interpolator that is simple—few adders, no dividers, and multipliers with only one variable input. A FIFO stores the values to be interpolated together with the corresponding time-of-occurrence of the values. Differencers calculate the value increments and the corresponding interpolation intervals. During an interval, the value increment is accumulated at each clock cycle, and the accumulation is compared with thresholds at multiples of the interpolation interval. The number of thresholds that have been exceeded is measured, and a differencer calculates the increment of that number. This increment is then used as the increment of the interpolated value.

It is a further objective to use this simple, high-speed interpolator with numerical phase detectors to provide phase samples that are smooth when resampled, even when the original phase samples have irregular spacing.

BRIEF DESCRIPTION OF THE SEVERAL VIEWS OF THE DRAWINGS

FIG. 1 is block diagram of a numerical phase detector with immediate resampling.

FIG. 2 is a circuit diagram of a numerical phase detector.

FIG. 3 is a plot of the waveforms in the numerical phase detector.

FIG. 9 including FIG. 9(a) and FIG. 9(b) shows plots of accumulated increments to provide interpolation. FIG. 9(a) involves fractional numbers, while FIG. 9(b) involves only integers.

FIG. 16 is a table of parameter values in the programmable accumulator.

FIG. 17 is a table of parameter values in the interpolator.

DETAILED DESCRIPTION OF THE INVENTION

Figure 7:
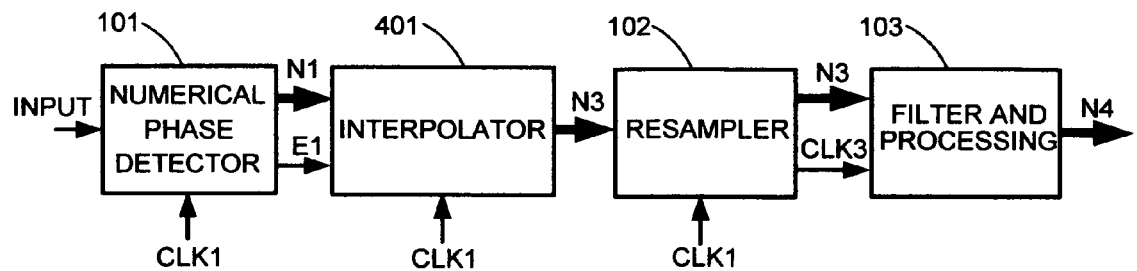
FIG. 7 is block diagram of a numerical phase detector with phase value interpolation before the resampling.
Figure 8:
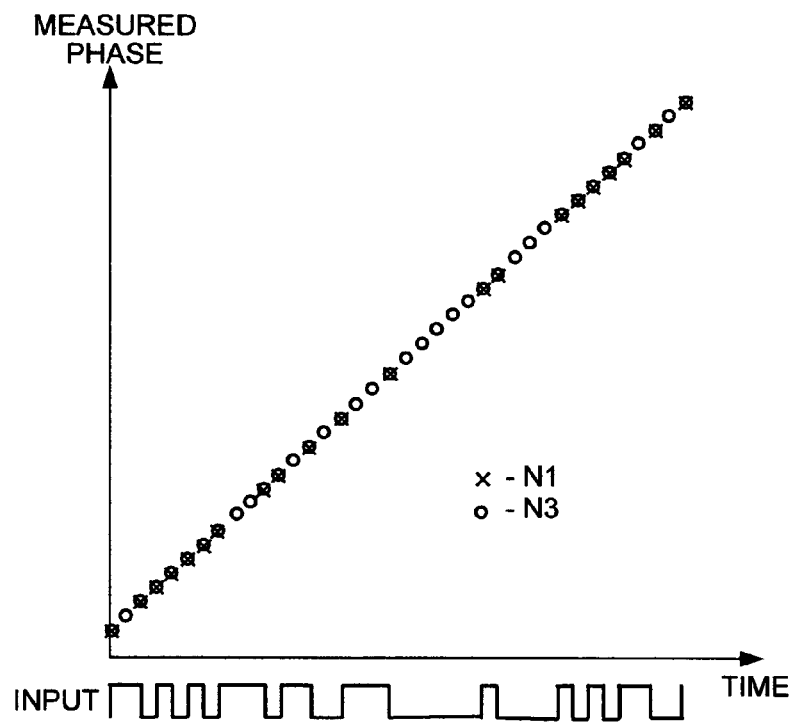
FIG. 8 is a plot of resampled phase values when phase value interpolation precedes the resampling.

FIG. 7 is a block diagram of a phase measurement system comprising a numerical phase detector 101, an interpolator 401, a resampler or decimator 102, and a stage of filtering and processing 103. FIG. 2 is a circuit diagram of the numerical phase detector 101. A high-speed clock CLK1 together with an n-bit counter 204 provide the coarse phase resolution. An edge of the INPUT signal is detected by D flip-flops 201 and 202 and NOR gate 203, which produce a pulse on the signal E1 corresponding to the input edge. This pulse strobes the current value CNT1 of counter 204 into D flip-flop 205 as the value J. The value of n in the n-bit counter 204 is chosen so that $2^n$ is greater than the number of CLK1 cycles between any two consecutive edges of the INPUT signal. FIG. 3 shows an example of the waveforms corresponding to these parameters. Note that J and K (and therefore N1) remain unchanged when there is no pulse on E1, that is, when the INPUT signal has no edge during the current cycle of CLK1.

It is usually desirable to have phase resolution that is smaller than one cycle of clock CLK1. The fine phase resolution circuit 206 provides a number K proportional to the position of the input edge within the current cycle of CLK1. If one cycle of CLK1 is greater than the fine resolution by a factor $2^p$, the complete phase value N1 can be formed simply by using K for its lower p bits and J for its upper n bits. This is illustrated in FIG. 3, where N1 is a concatenation of J and K. For example, when J=E (hex for 15) and K=7 for p=3, then N1=$2^p$×J+K=8×15+7=127. The fine phase resolution circuit 206 can be realized by using delay elements, as in U.S. Pat. Nos. 5,867,693 and 6,255,866, by using a clock with multiple phases as in U.S. Pat. Nos. 6,255,866 and 6,693,985, or by sampling in-phase and quadrature clocks as in U.S. Pat. No. 4,910,465.

The phase number N1 constantly increases until it folds over when reaching the value $2^{n+p}$, where n is determined by the construction of the n-bit counter 204 and p is determined by the fine phase resolution circuit 206. If the input signal is NRZ data with nominal frequency and no phase modulation, it is desirable that N1 be a constant value. Let the frequency of the clock CLK1 be chosen so that the nominal unit interval of the data signal is a factor of $2^m$ times greater than one cycle of CLK1. For the example shown in FIG. 3, m=1 since the nominal unit interval of the INPUT signal is twice the duration of a CLK1 cycle. Then N1 becomes a constant for no phase modulation if N1 is taken modulo $2^{m+p}$. A simple way to take the modulo $2^{m+p}$ of N1 is to constrain N1 to m+p bits, discarding the upper n−m bits. This will be done in the interpolator. The value of N1 is no longer constrained to be constantly increasing—it increases or decreases with the phase of the INPUT signal.

Figure 4:
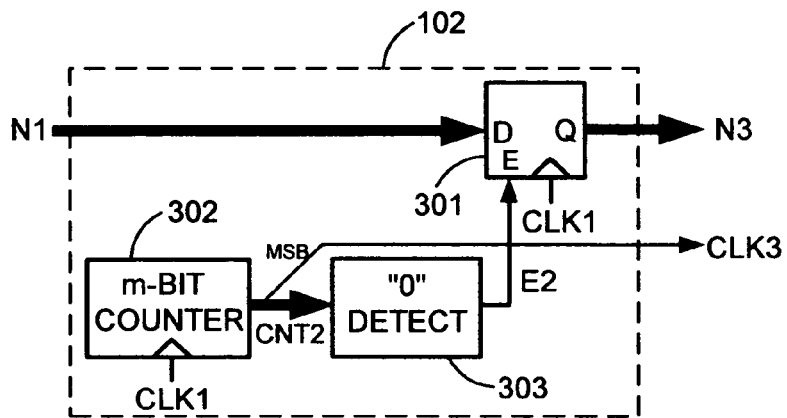
FIG. 4 is circuit diagram of a resampler.
Figure 5:
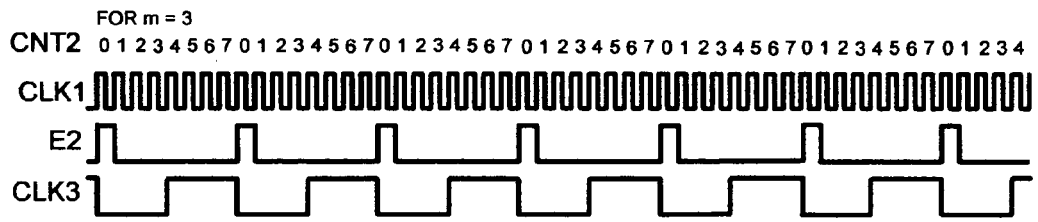
FIG. 5 is a plot of the waveforms in the resampler.
Figure 6:
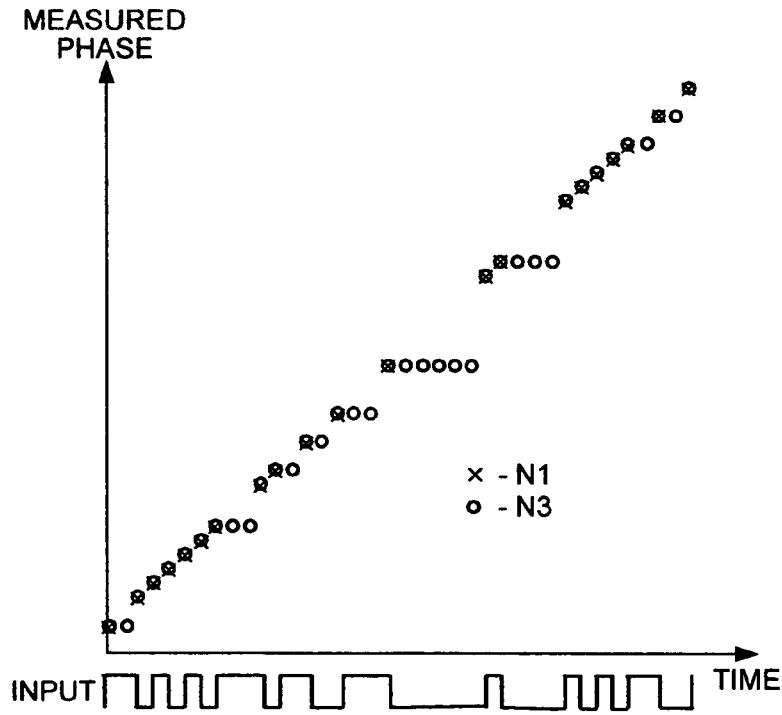
FIG. 6 is a plot of resampled phase values when there is no interpolation.

Clock CLK1 has a high frequency to make the coarse phase resolution as fine as possible. The same clock provides phase values N1, as shown in FIG. 3. But because of the high clock speed, the values are provided too often; there is redundant information. Therefore the data is usually decimated—resampled at a lower clock rate. FIG. 4 is a circuit diagram of resampler 102. Every time the m-bit counter 302 reaches a count of CNT2=0, the "0" detect circuit 303 produces a pulse on signal E1. This pulse strobes a value of N1 into the D flip-flop 301. Thus the data stream N3 consists of every Mth value of N1, where M=$2^m$. The resampler also provides a low-speed clock signal CLK3 at 1/M of the CLK1 frequency. This CLK3 signal is to be used in subsequently processing the N3 values. It is usually an advantage to choose the value of m in resampler 102 so that the frequency of CLK3 is the same as the nominal baud of the INPUT signal (see FIG. 2 and FIG. 3).

Figure 9:
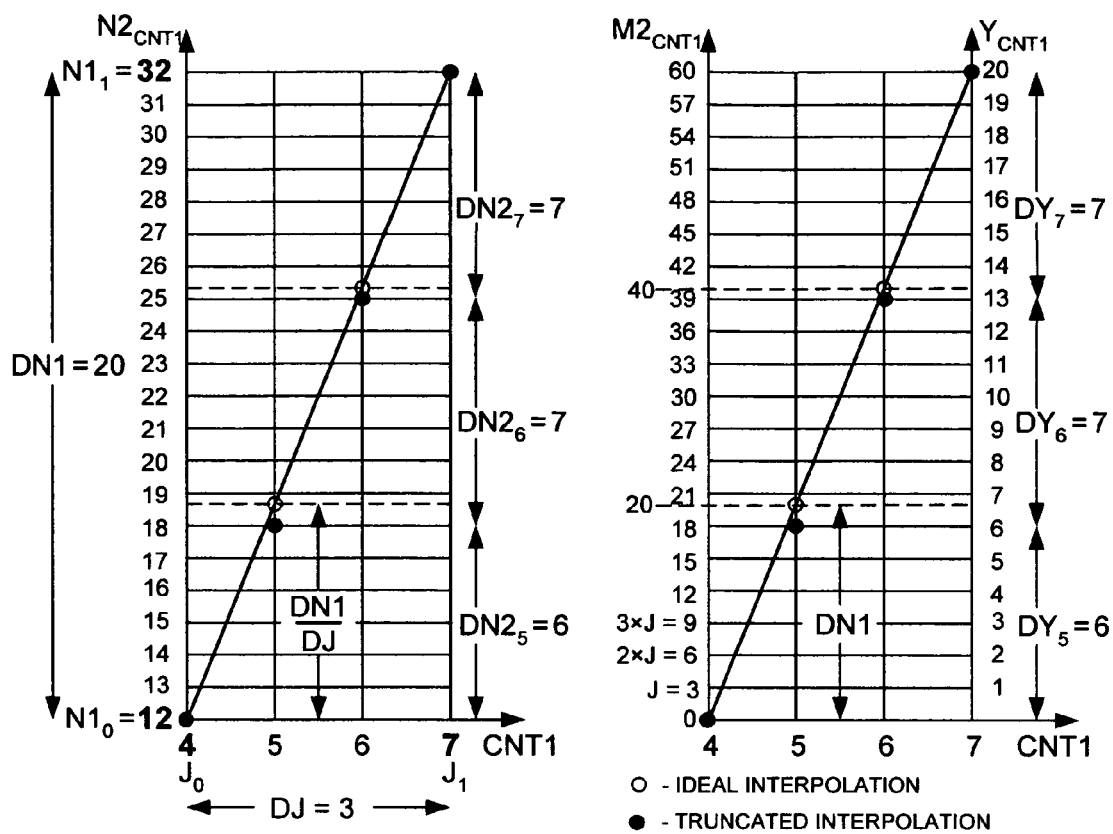

FIG. 9 illustrates the algorithm for interpolating between two phase values $N1_0$ and $N1_1$ that occur at times $J_0$ and $J_1$, respectively. In this example $N1_0$=12, $N1_1$=32, $J_0$=4, and $J_1$=7. The difference between successive values of N1 is DN1=$N1_1$−$N1_0$=1 0. The difference between JS is DJ=$J_1$−$J_0$=3. So the change of 20 in N1 is to be distributed as evenly as possible over the DJ=3 counts of CNT1 (3 cycles of CLK1) that separate the occurrence of $N1_0$ and $N1_1$.

FIG. 9(a) illustrates a simple approach to interpolation. The three increments must total DN1=20, so each increment is ideally DN1/DJ=6⅔. This increment is added to $N1_0$=12 three times to produce the interpolated sequence 12, 16⅔, 25⅓, 32. After truncation to integers, the final interpolated sequence $N2_{CNT1}$ is 12, 16, 25, 32. The increments $DN2_{CNT1}$=$N2_{CNT1}$−$N2_{CNT1-1}$ are $DN2_5$=6, $DN2_6$=7, $DN2_7$=7. The disadvantage of this simple interpolation algorithm is that it deals with fractions, which require division or multiplication. Although simple in concept, this algorithm leads to circuitry that is complicated and expensive to realize.

FIG. 9(b) illustrates an interpolation algorithm that deals only with integers without resort to division or two-variable multiplication. Here the vertical scale has been multiplied by DJ=3 to eliminate all fractions. Now the increment to be accumulated is DN1=20 rather than DN1/DJ=6⅔, and the parameter $M2_{CNT1}$ on the left scale has a range of 60 compared with DN1=20 in FIG. 9(a). The parameter $Y_{CNT1}$ (right scale) can be calculated from $M2_{CNT1}$/DJ=$M2_{CNT1}$/3. But to avoid division, $Y_{CNT1}$ will be calculated by the following method. Establish thresholds at J=3, 2×J=6, 3×J=9, etc. and count how many thresholds $M2_{CNT1}$ equals or exceeds. For example, $M2_5$=20 exceeds 6 thresholds—those at 3, 6, 9, 12, and 18. Therefore $Y_5$=6. The increments $Y_{CNT1}$=$Y_{CNT1}$−$Y_{CNT1-1}$ are $DY_5$=5, $DY_6$=7, $DY_7$=7. These are the same as the $DN2_5$=6, $DN2_6$=7, $DN2_7$=7 in FIG. 9(a). Therefore the final interpolated $N2_{CNT1}$ is formed by accumulating the $DY_{CNT1}$ on an initial $N1_0$=12, resulting in the sequence 12, 16, 25, 32 as before. The same interpolation has been achieved without dividers or two-variable multipliers.

Figure 10:
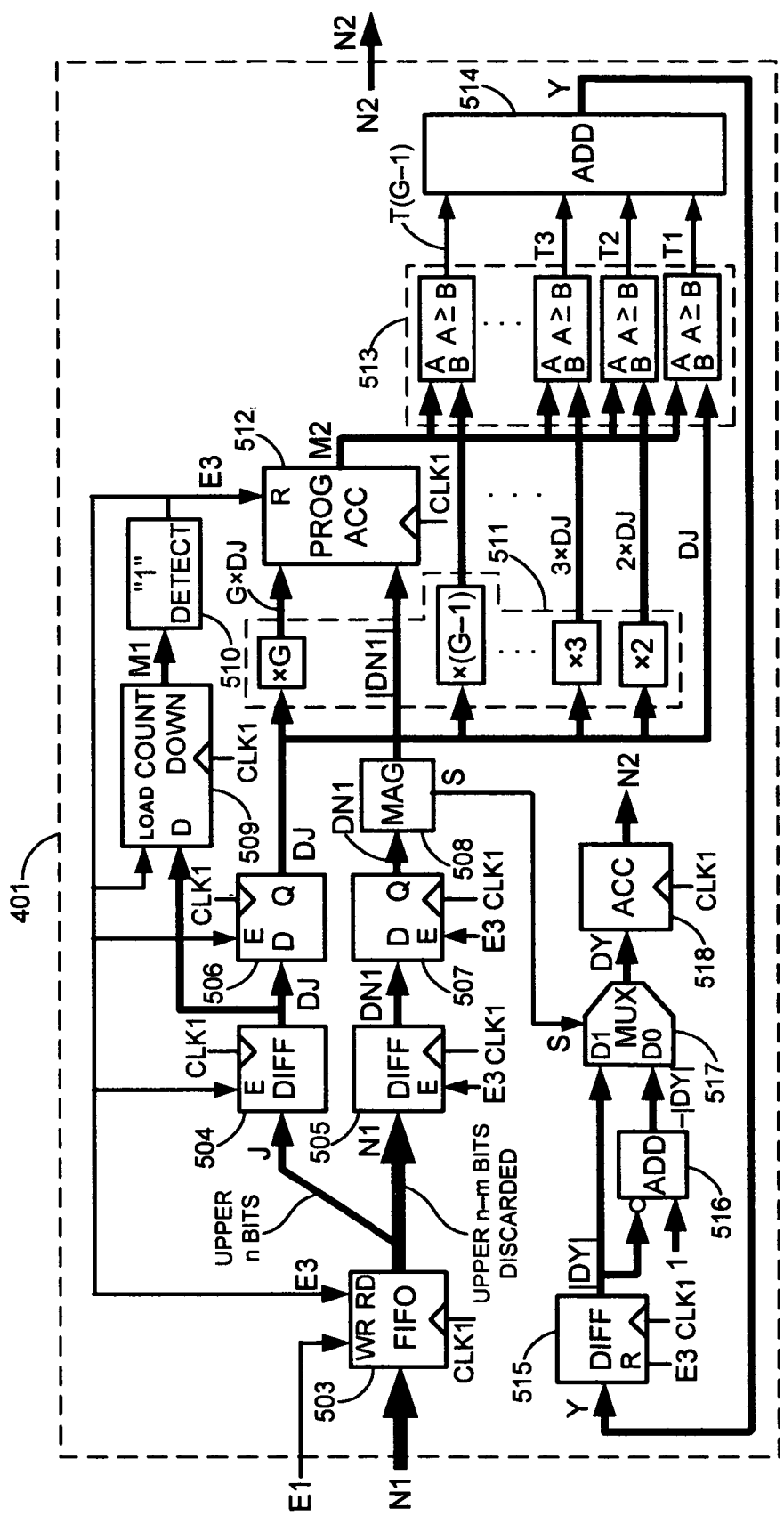
FIG. 10 is a circuit diagram of the preferred embodiment of the interpolator.
Figure 11:
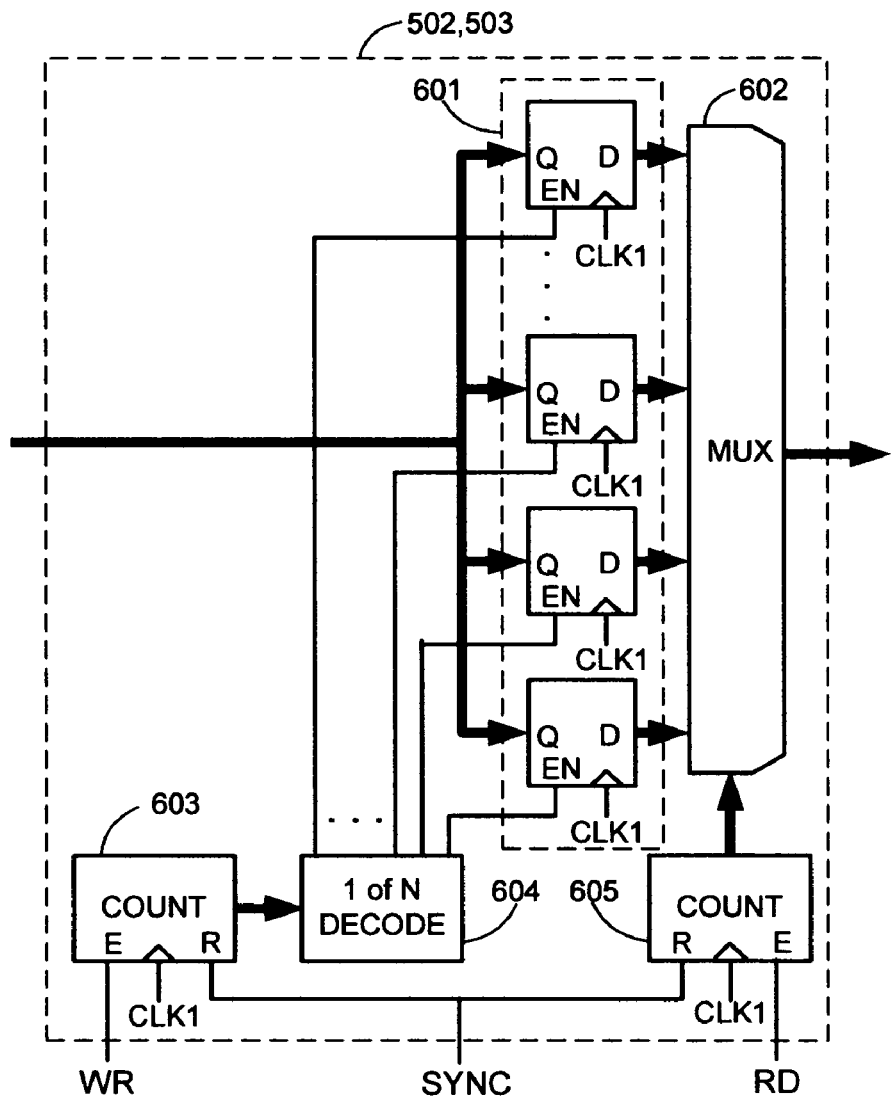
FIG. 11 is a circuit diagram of the FIFO in the interpolator.
Figure 12:
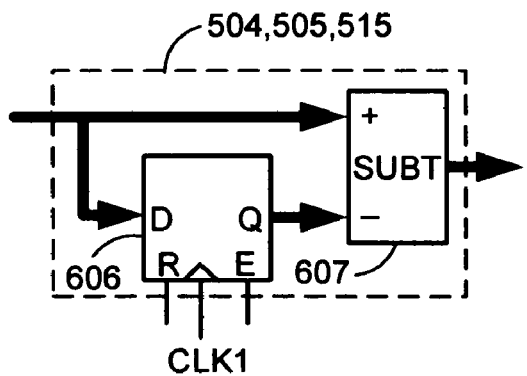
FIG. 12 is a circuit diagram of the differencers in the interpolator.
Figure 13:
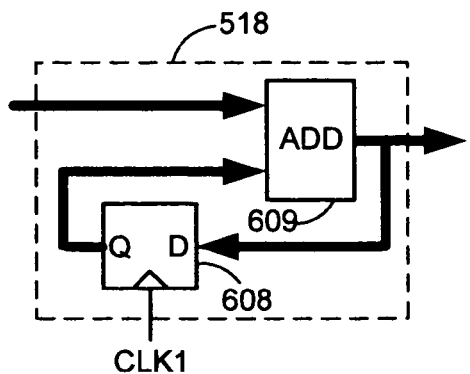
FIG. 13 is a circuit diagram of the accumulators in the interpolator.
Figure 14:
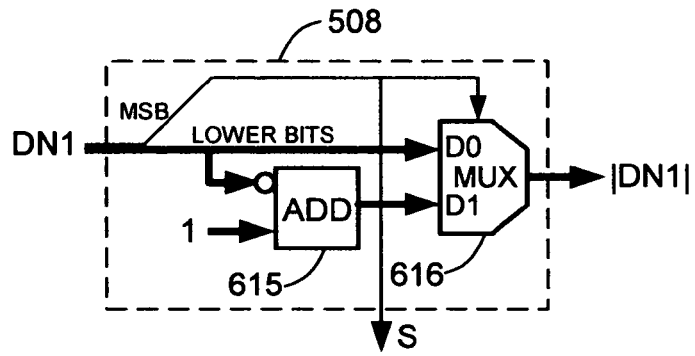
FIG. 14 is a circuit diagram of the magnitude calculator in the interpolator.

The circuit in FIG. 10 realizes the interpolation algorithm illustrated in FIG. 9(b). The N1 and J data must be buffered in a FIFO 503 since interpolation over an interval must take place after that interval has occurred. As shown in FIG. 2, the N1 values contain the J data. The J data is separated from the N1 data after the FIFO by taking the n upper bits. The difference DJ between successive J values is performed by the differencer 504, whose circuit is shown in FIG. 12. The DJ sequence is pipeline-delayed in D flip-flop 506. The N1 values are restricted to m+p bits by discarding the n−m top bits, differenced in 505 to form the DN1 sequence, and pipeline-delayed in D flip-flop 507. Since DN1 can be either positive or negative, the circuitry is simplified by removing the sign S in magnitude calculator 508 and reapplying the sign near the end of the algorithm. The value DN1 with the sign removed is represented by |DN1|. FIG. 14 shows the magnitude calculator circuit.

Before the FIFO, the start of a new interpolation interval is indicated by a pulse on E1. Similarly, after the FIFO the beginning of a new interpolation interval is indicated by a pulse on E3. This pulse occurs when the countdown circuit 509 reaches a count M1=1. A pulse on E3 loads the new value of DJ into the countdown, and the next pulse on E3 comes DJ cycles of CLK1 later. At this time a new value of DJ is loaded into the countdown, and the cycle repeats. The pulse on E3 also resets the programmable accumulator 512 with output M2. During the interpolation interval, CLK1 adds the current value of |DN1| to the programmable accumulator, increasing M2. M2 is compared with thresholds at J, 2×J, 3×J, etc. by a multiplicity of comparators 513. The number of thresholds that have been met or exceeded is totaled by adder 514. The difference |DY| between successive values of Y is performed by differencer 515. The sign is reapplied by adder 516 and multiplexer 517 to produce the values DY. As is shown in FIG. 9, these DY are the same as the desired differences DN2. Therefore these values are accumulated by accumulator 518 to produce the interpolated sequence N2. Accumulator 518 can be loaded with an initial value if desired.

The size of the programmable accumulator 512 and the number or thresholds can be reduced by taking advantage of modulus mathematics. In particular, if M2 is taken modulo G×DJ then only G-1 thresholds need be provided, and Y will be taken modulo G. So long as G is larger than greatest DN1/DJ+1, then the value of DY is unaffected—it is the same as if no modulus were applied. G should be a power of 2 so the modulus can be implemented by restricting to $\log_2(G)$ the number of bits representing Y. For example, in FIG. 9(b) G could be chosen to be 8, which is greater than DN1/DJ+1=20/3+1=7⅔. Then only seven thresholds are required—at 3, 6, 9, 12, 15, 18, 21. M2 is taken modulo G×DJ=24, so the M2 sequence 0, 20, 40, 60 becomes 0, 20, 16, 12. The number of thresholds each of these equals or exceeds gives the Y sequence 0, 6, 5, 4. The successive differences of these values give the sequence 6, −1, −1, but this subtraction was not performed modulo G=8. Applying the modulus of 8 (in which only the integers 0, 1, 2, 3, 4, 5, 6, and 7 are allowed) to the difference sequence, we get the DY sequence 6, 7, 7 as before.

Figure 15:
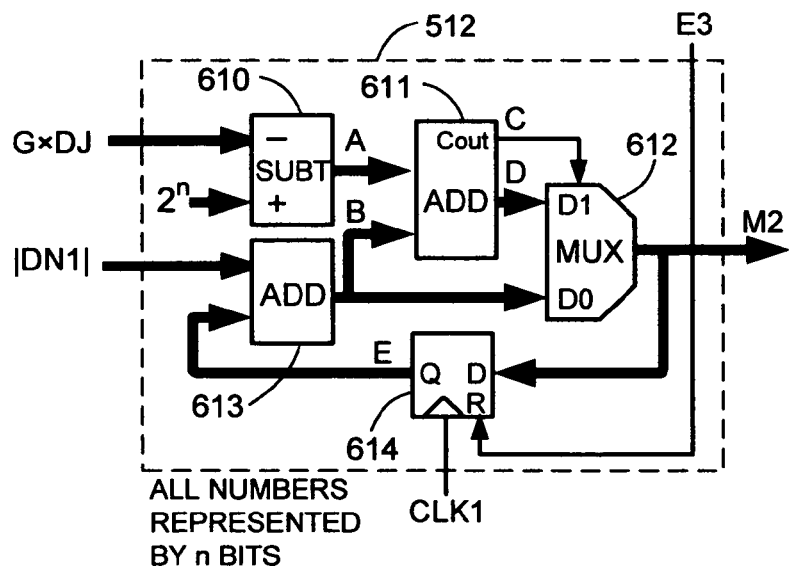
FIG. 15 is a circuit diagram of the programmable accumulator in the interpolator.

FIG. 15 shows the programmable accumulator circuit. Because all of the numbers in the circuit are represented by n bits, the output M2 would normally be modulo $2^n$. If the value M2 is to be taken modulo G×DJ (where G×DJ is less than M2), the accumulator must be made to overflow earlier than normal. For example, if G×DJ=32 and $2^n$=128, the number A=$2^n$−G×DJ=96 must be added to numbers B=32 or greater to cause overflow. For this value of A the carry out C from adder 611 is a 1 when B is 32 or greater. C=1 causes the multiplexer 612 to select A rather than B as the output M2. When B is less than 32, then C=0, selecting B as the output. The modulus G×DJ is programmable, changing as DJ changes. FIG. 16 is a table of the parameters in the programmable accumulator. CNT1 counts the clock cycles of CLK1. When E3=1, it resets D flip-flop 614, causing E=0 on the next clock cycle. When the output is M2=21, the next application of |DN1|=21 accumulates to M2=10, which is 21+21=42 modulo 32.

Figure 18:
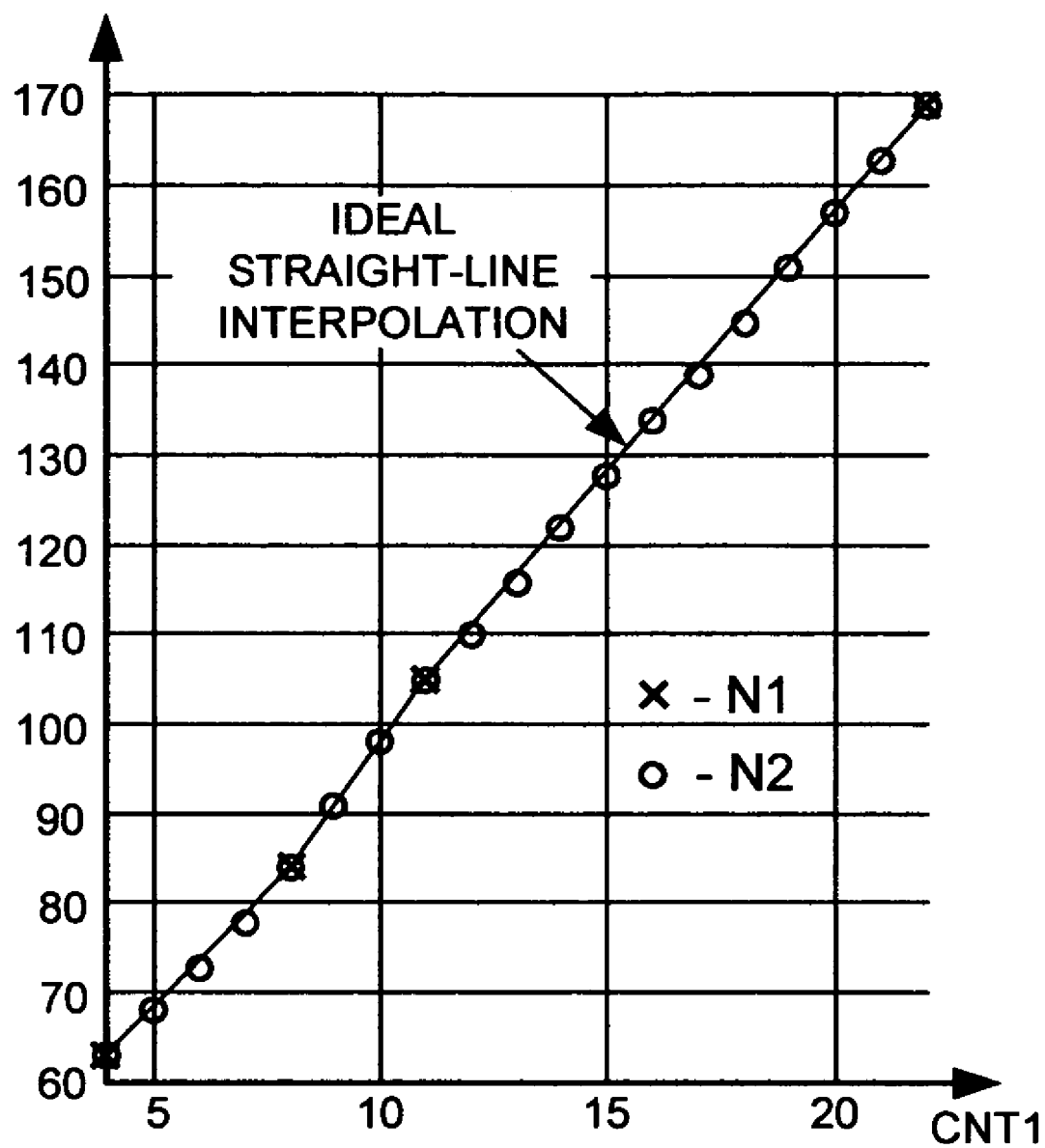
FIG. 18 is a plot of the input and output phase values of the interpolator.

FIG. 17 is a table of the parameters in the whole interpolator circuit shown in FIG. 10. In this example, G=8. The delay of the FIFO is ignored so the N1 values can be more easily compared with the interpolated N2 values. Note that M2 accumulates the DN1 modulo G×DJ, and DY is the difference of successive values of Y modulo G=8. The values of N1 and the interpolated N2 are plotted and compared in FIG. 18. Note that the interpolated values to be on or below the line of ideal interpolated values (due to quantization), but the difference is always less than 1.

It will be understood by those skilled in the art that various changes in the form and details of the preferred embodiment described here may be made without departing from the spirit and scope of the invention as defined in the appended claims.

What is claimed:

1. A phase measurement system comprising
a numerical phase detector to receive an input signal with edges or other significant instants and to provide numerical phase values responsive to the time position of those significant instants;
an interpolator apparatus coupled to the numerical phase detector to receive said numerical phase values at irregular intervals and provide interpolated phase values at smaller, regular intervals;
a resampler circuit coupled to the interpolation apparatus to receive said interpolated phase values and decimate them, providing phase values at a lower, regular rate.

2. An apparatus for receiving input values that are spaced at irregular intervals and providing interpolated output values at regular output intervals that are shorter than the input intervals, comprising
a buffer-differencer circuit to receive said input values and their times of occurrence and store the input values and their times of occurrence and
take the difference between successive input values, either before of after the storing function and
take the difference between their successive times of occurrence, either before of after the storing function and
provide the input value differences and the times-of-occurrence differences (hereinafter referred to as the input intervals) upon request from a strobe signal;
a countdown circuit coupled to the buffer-differencer circuit to receive said input intervals and provide a strobe signal at intervals responsive to the input intervals;
a first accumulator circuit coupled to the buffer-differencer circuit and to the countdown circuit to receive said input value differences and said strobe signal, wherein the strobe signal resets the accumulator, and to provide an accumulated value that increases by increments proportional to the input value differences;
a comparator circuit coupled to the accumulator circuit to receive said accumulated value and
compare the accumulated value with a plurality of thresholds and
provide a count of the number of thresholds that are less than the accumulated value;
a differencer circuit coupled to the comparator circuit to receive said count and provide the difference between successive counts as count differences;
a second accumulator circuit coupled to the differencer circuit to accumulate said count differences and provide the interpolated phase values.

3. An apparatus for interpolating as described in claim 2 wherein
the comparator circuit has a modulus proportional to a designed constant and
the first accumulator circuit has a programmable modulus proportional to the product of the designed constant times said input intervals.

4. A phase measurement system comprising
a numerical phase detector to receive an input signal with edges or other significant instants and to provide numerical phase values responsive to the time position of those significant instants;

an interpolator apparatus according to claim 2;

a resampler circuit coupled to the interpolation apparatus to receive said interpolated phase values and decimate them, providing phase values at a lower, regular rate.

5. A phase measurement system comprising a numerical phase detector to receive an input signal with edges or other significant instants and to provide numerical phase values responsive to the time position of those significant instants;

an interpolator apparatus according to claim 2 wherein the comparator circuit has a modulus proportional to a designed constant and the first accumulator circuit has a programmable modus proportional to the product of the designed constant times said input intervals;

a resampler circuit coupled to the interpolation apparatus to receive said interpolated phase values and decimate them, providing phase values at a lower, regular rate.

* * * * *